US009529255B2

(12) United States Patent
Lu et al.

(10) Patent No.: US 9,529,255 B2
(45) Date of Patent: Dec. 27, 2016

(54) IMAGE PROCESS METHOD TO IMPROVE MASK INSPECTION PERFORMANCE

(71) Applicant: Taiwan Semiconductor Manufacturing Co., Ltd., Hsin-Chu (TW)

(72) Inventors: Meng-Lin Lu, Keelung (TW); Ching-Ting Yang, Tainan (TW); Chun-Jen Chen, Renwu Township (TW); Chien-Hung Lai, Taichung (TW); Jong-Yuh Chang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/096,167

(22) Filed: Dec. 4, 2013

(65) Prior Publication Data

US 2015/0154326 A1 Jun. 4, 2015

(51) Int. Cl.
*G06F 17/50* (2006.01)
*G03F 1/84* (2012.01)

(52) U.S. Cl.
CPC .................................... *G03F 1/84* (2013.01)

(58) Field of Classification Search
USPC .................................................. 716/52
See application file for complete search history.

(56) References Cited

U.S. PATENT DOCUMENTS

| | | | | |
|---|---|---|---|---|
| 7,231,628 | B2 | 6/2007 | Pack et al. | |
| 8,407,627 | B2 | 3/2013 | Pack et al. | |
| 2002/0019729 | A1* | 2/2002 | Chang et al. | 703/6 |
| 2006/0273266 | A1 | 12/2006 | Preil et al. | |
| 2008/0127027 | A1* | 5/2008 | Gallatin et al. | 716/19 |
| 2009/0290784 | A1* | 11/2009 | Lin et al. | 382/149 |
| 2012/0051621 | A1 | 3/2012 | Ong et al. | |

* cited by examiner

*Primary Examiner* — Bryce Aisaka
(74) *Attorney, Agent, or Firm* — Eschweiler & Associates, LLC

(57) ABSTRACT

The present disclosure relates to a method of inspecting a photomask to decrease false defects, which uses a plurality of image rendering models with varying emphasis on different design aspects, and an associated apparatus. In some embodiments, the method is performed by forming an integrated circuit (IC) design comprising a graphical representation of an integrated circuit. A first image rendering simulation is performed on the IC design using an initial image rendering model to determine a plurality of initial mask defects. A second image rendering simulation is performed on the IC design using a modified image rendering model that emphasizes a design aspect to determine a plurality of modified mask defects. By comparing the plurality of initial mask defects with the plurality of modified mask defects, falsely identified mask defects can be detected and eliminated.

20 Claims, 5 Drawing Sheets

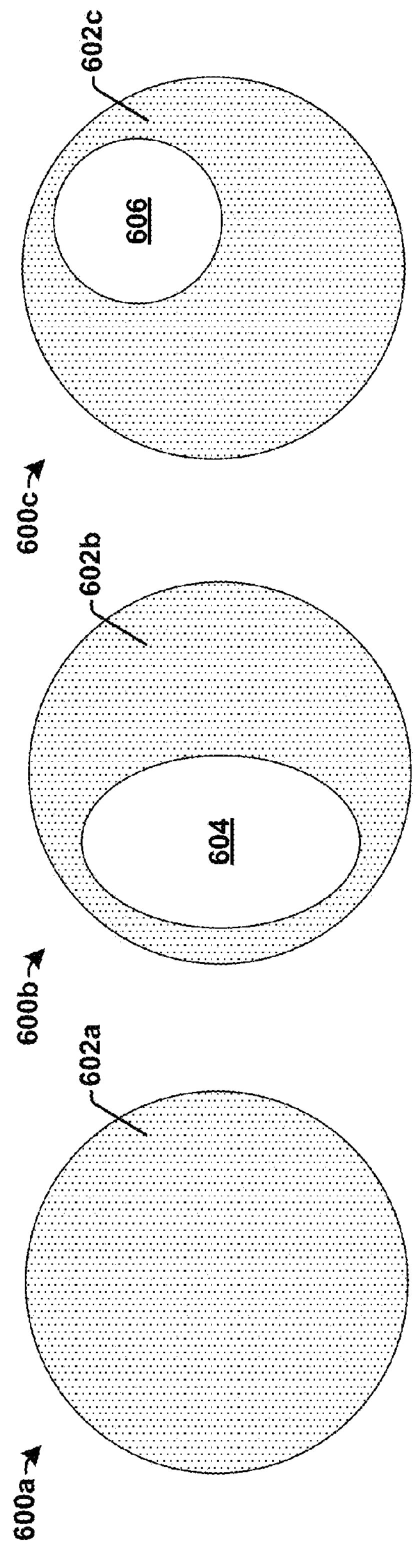
Fig. 6A
Fig. 6B
Fig. 6C
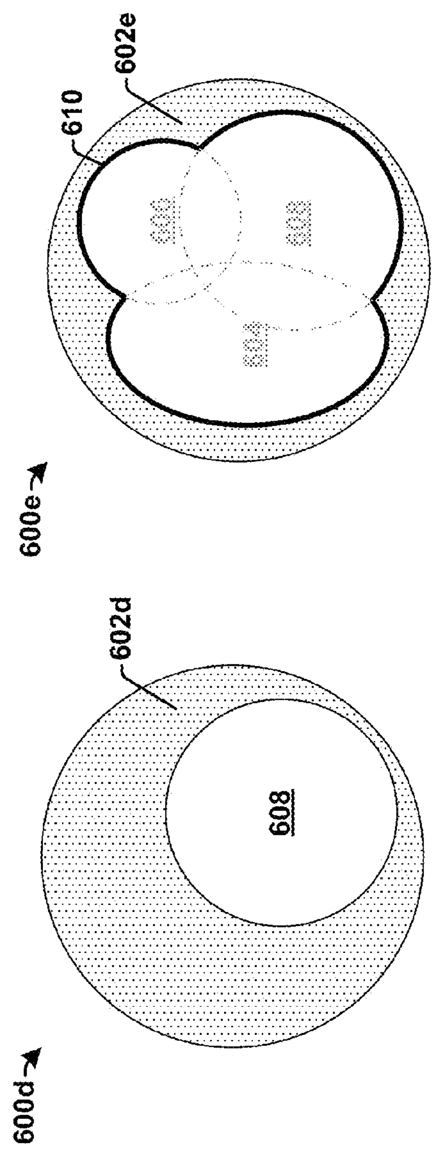
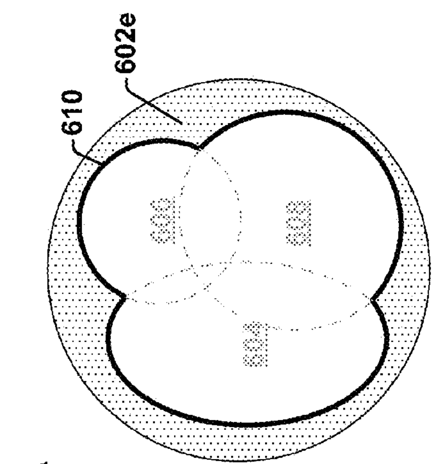
Fig. 6E
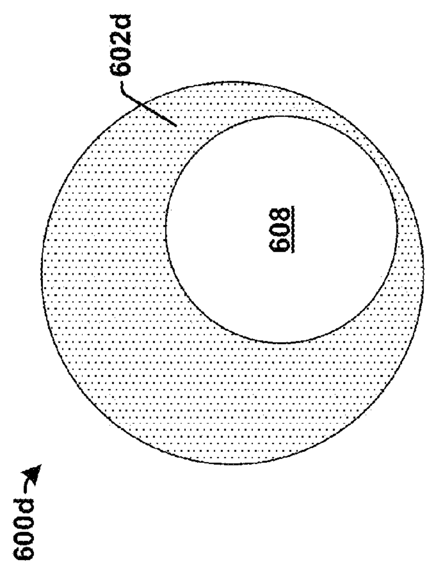
Fig. 6D

IMAGE PROCESS METHOD TO IMPROVE MASK INSPECTION PERFORMANCE

An integrated circuit is formed by first generating an integrated circuit (IC) design that describes a physical layout of an integrated circuit on a computer. A photomask is then formed from the IC design. The photomask is used during IC fabrication to pattern a semiconductor substrate to form on-chip structures that correspond to the IC design. The photomask is usually inspected for mask defects before being used to replicate mask images on semiconductor substrates used in products. If mask defects are detected, they can be repaired so that the mask defects are not replicated on the semiconductor substrates.

BRIEF DESCRIPTION OF THE DRAWINGS

FIGS. 6A-6E illustrate some embodiments of set diagrams showing the mitigation of false mask defects by a mask inspection process corresponding to the method described in FIG. 5.

DETAILED DESCRIPTION

Figure 1:
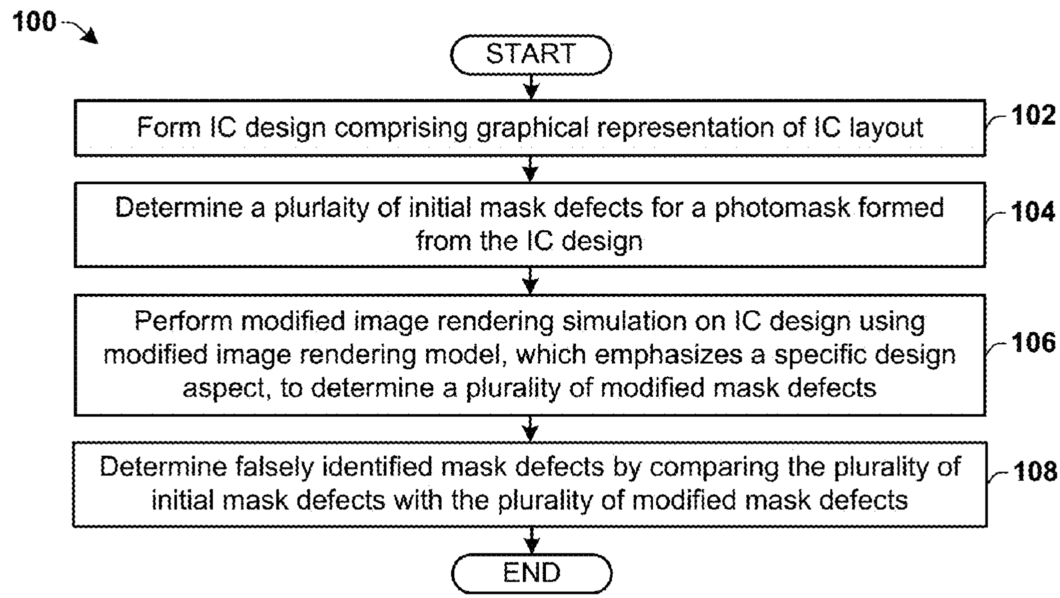
FIG. 1 illustrates a flow diagram of some embodiments of a method of inspecting a photomask, which uses a plurality of image rendering models with varying emphasis on different design aspects to decrease falsely identified mask defects.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Integrated circuit (IC) designs (i.e., layouts) comprise a plurality of shapes that represent on-chip structures. To ensure that a photomask is properly generated from an IC design, mask inspections may be performed by comparing the IC design with an optically obtained image of a corresponding on-chip structure. However, due to changes that occur during IC fabrication processes, an on-chip structure may have a different size, shape, and/or amplitude (i.e., gray level) than a corresponding shape in an IC design, thereby preventing accurate comparisons between on-chip structures and a corresponding IC design. To avoid this problem, data from an IC design may be acted upon by an image rendering simulation, which simulates IC fabrication processes to form a reference image that is representative of an on-chip structure. The reference image more closely matches the on-chip shapes so that mask inspection can be accurately performed.

The accuracy of a reference image is directly correlated to the accuracy of mask inspection (i.e., as an image rendering simulation become more accurate, mask inspection improves). To improve the accuracy of a reference image, on-chip calibration patterns may be used to calibrate models used by an image rendering simulation. The more calibration patterns that are used, the more accurate a resulting reference image. However, since the use of more calibration patterns takes more time and increases the complexity of a simulation, the accuracy of a reference image is practically limited. For example, without increasing the total number of calibration patterns, the use of more calibration patterns to increase the accuracy of one design aspect (e.g., corner rounding) may decrease the accuracy of other design aspects (e.g., size).

With the demand for better mask inspection performance, the accuracy of image rendering is an important point in a die-to-database inspection mode. However, the challenge of image rendering increases in advanced technology nodes, since mask design is more complicated owing to the aggressive optical proximity correction (OPC), inverse lithography technology (ILT), and source mask optimization (SMO). The tiny jogs and complex features on the masks cause tens of thousands of nuisance defects which are reviewed and dispositioned by manpower. Moreover, engineers may reduce the sensitivity of the inspection system to reduce the number of defects to a reasonable level, and thereby increase the chances that killing defects will be missed. In order to prevent such dilemma, the precise image rendering for die-to-database inspection is the first priority for advanced mask making flow.

Accordingly, the present disclosure relates to a method of inspecting a photomask to decrease false mask defects that uses a plurality of image rendering models with varying emphasis on different design aspects, and an associated apparatus. In some embodiments, the method comprises forming an integrated circuit (IC) design comprising a graphical representation of an integrated circuit. A first image rendering simulation is performed on the IC design using an initial image rendering model to determine a plurality of initial mask defects. A second image rendering simulation is performed on the IC design using a modified image rendering model that emphasizes a selected design aspect to determine a plurality of modified mask defects with an increased accuracy with regard to the selected design aspect. By comparing the plurality of initial mask defects with the plurality of modified mask defects, falsely identified mask defects relating to the selected design aspect can be detected and eliminated.

FIG. 1 illustrates a flow diagram of some embodiments of a method 100 of inspecting a photomask, which uses a plurality of image rendering models with varying emphasis on different design aspects to decrease false mask defects.

At 102, an integrated circuit (IC) design comprising a graphical representation of an integrated circuit layout is formed. The IC design comprises a plurality of design shapes that represent structures to be formed on-chip. For example, the graphical representation may comprise design shapes corresponding to on-chip vias or metal interconnect lines, for example.

At 104, a plurality of initial mask defects are determined for a photomask formed from the IC design. In some embodiments, the plurality of initial mask defects are determined by performing an initial image rendering simulation using an initial image rendering model to determine. The initial image rendering simulation is configured to simulate changes that occur to design shapes during IC fabrication processes. For example, the initial image rendering simulation may generate a reference image that approximates changes in the size, corner rounding, and/or amplitude (i.e., a gray level value that is due to topography changes in an on-chip structure) of a design shape due to IC fabrication processes. In other embodiments, the plurality of initial mask defects may be determined by a comparison of the IC design to a test image.

At 106, a modified image rendering simulation is performed using a modified image rendering model, which emphasizes a selected design aspect (e.g., size, corner rounding, etc.), to determine a plurality of modified mask defects. The modified image rendering simulation is configured to simulate changes that occur to design shapes of the IC design during IC fabrication processes with a heightened (i.e., increased) accuracy of the selected design aspect. Since the modified image rendering simulation provides for a heightened accuracy of the selected design aspect, the simulation will yield less false mask defects with respect to the selected design aspect.

At 108, falsely identified mask defects are determined by comparing the plurality of initial mask defects with the plurality of modified mask defects. Comparing the plurality of initial mask defects with the plurality of modified mask defects identifies falsely identified mask defects that result from the limited accuracy of the initial image rendering model. The falsely identified mask defects can be subsequently removed from the initial number of mask defects, thereby reducing the number of false mask defects and improving mask inspection.

Figure 2:
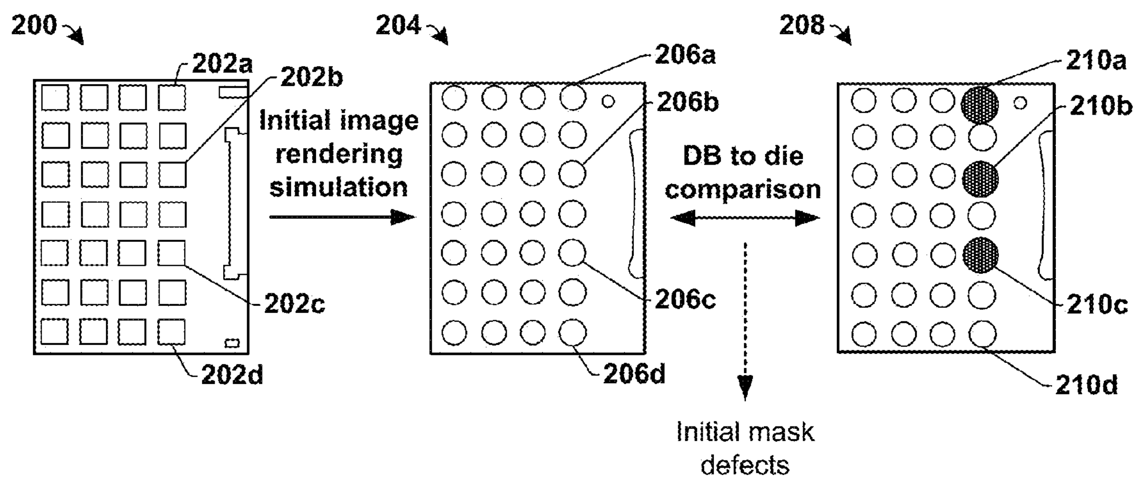
FIGS. 2-3 illustrate some embodiments of diagrams corresponding to the method of inspecting a photomask described in FIG. 1.
Figure 3:
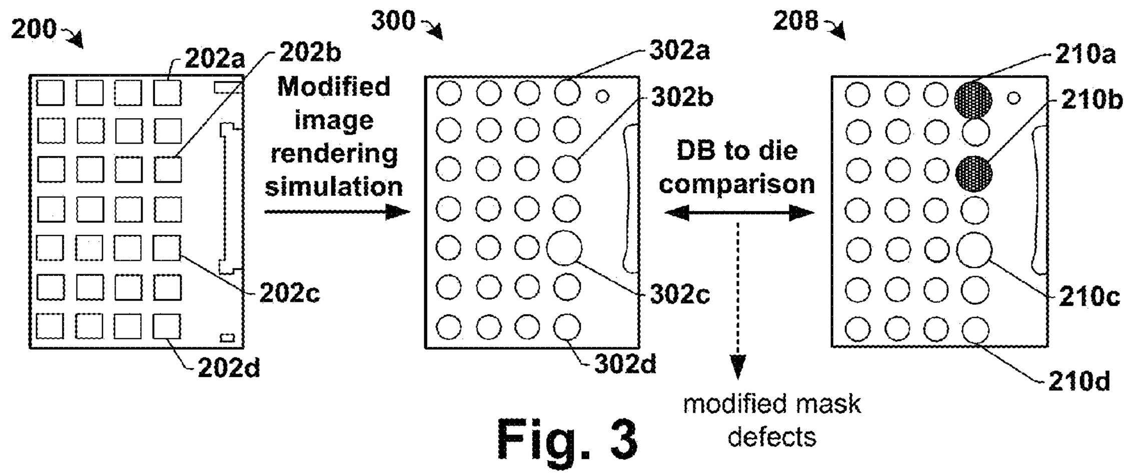

FIGS. 2-3 illustrate some embodiments of diagrams showing a mask inspection process corresponding to method 100 of FIG. 1.

FIG. 2 illustrates some embodiments of an initial image rendering simulation being used to determine a plurality of initial mask defects, as described in act 104.

An integrated circuit (IC) design 200, comprising a graphical representation of an integrated circuit layout after optical proximity correction (OPC) has been performed, has a plurality of design shapes 202. The plurality of design shapes 202 correspond to features of a mask. In various embodiments, the IC design 200 may comprise a Graphic Database System (GDS) file, such as a GDS or GDSII file. In other embodiments, the IC design 200 may comprise a CIF (Caltech Intermediate Format) file, an OASIS file, or some other similar file format, for example.

Operating upon the IC design 200 using an initial image rendering simulation results in an initial reference image 204. The initial reference image 204 comprises initial reference image shapes 206 that are modified in accordance with changes that occur during an IC fabrication process (e.g., changes in size, corner rounding, amplitude, etc.). For example, an IC fabrication process may cause a square design shape 202*a* to undergo corner rounding, such that a corresponding initial reference image shape 206*a* comprises a circular shape having a different size.

To determine an initial number of mask defects, the initial reference image 204 may be compared to a test image 208. The test image 208 may be obtained by an optical based system or an electronic based system, configured to provide images of on-chip structures. Comparing the test image 208 with the initial reference image 204 allows for a plurality of initial mask defects (i.e., defects in a photomask formed from the IC design 200) to be detected in locations where shapes of the test image 208 do not sufficiently match corresponding shapes of the initial reference image 204. For example, the substantially different sizes of initial reference image shapes 204*a*-204*c* and on-chip shapes 210*a*-210*c* indicate three initial mask defects are present, since the sizes of on-chip shapes 210*a*-210*c* are different than what was expected by the simulated initial reference image shapes 204*a*-204*c*. The substantially same sizes of the initial reference image shape 206*d* and on-chip shape 210*d* indicate that no mask defect is present, since the size on-chip shape 210*d* is the same as what was expected by the simulated initial reference image shape 206*d*.

FIG. 3 illustrates some embodiments of a modified image rendering simulation being used to determine a plurality of modified mask defects, as described in act 106.

Operating upon the IC design 200, comprising a plurality of design shapes 202 having been subjected to OPC, using a modified image rendering simulation results in a modified reference image 300. The modified reference image 300 comprises reference image shapes 302 that are modified in accordance with changes that occur during an IC fabrication process. In various embodiments, the modified image rendering simulation may emphasize different design aspects (e.g., size, corner rounding, amplitude, etc.). By emphasizing a selected design aspect, the modified image rendering simulation will provide for a more accurate reference image with respect to the selected design aspect. For example, a modified image rendering simulation that emphasizes size will have modified reference image shapes that more accurately correspond to the size of on-chip shapes.

To determine a modified number of mask defects, the modified reference image 300 may be compared to a test image 208 comprising an image of on-chip structures. Comparing the test image 208 with the reference image 300 allows for a plurality of modified mask defects (i.e., defects in a photomask formed from the IC design 200) to be detected in locations where the test image 208 does not sufficiently match the modified reference image 300. For example, the different sizes of modified reference image shapes 206*a*-206*b* and on-chip shapes 210*a*-210*b* indicate that two initial mask defects are present, since the sizes of on-chip shapes 210*a*-210*b* are different than what was expected by the simulated modified reference image shapes 206*a*-206*b*.

By comparing the initial number of mask defects with the modified number of mask defects, falsely identified mask defects can be determined and eliminated to improve mask inspection. For example, design shape 202*c* was associated with an initial mask defect (as shown in FIG. 2) due to a difference in size between shapes 206*c* and 210*c*. However, comparison of the initial mask defects with the modified mask defects indicates that design shape 202*c* was associated with a falsely identified mask defect, since the modified image rendering simulation emphasizing size did not identify mask shape 302*c* as a modified mask defect.

Although the design aspects are described herein as comprising corner rounding, amplitude, and size, it will be appreciated that the referenced design aspects are not limited to such characteristics. Rather, the design aspects may comprise any changes to a shape of an IC design that may occur during an integrated circuit fabrication process.

Figure 4:
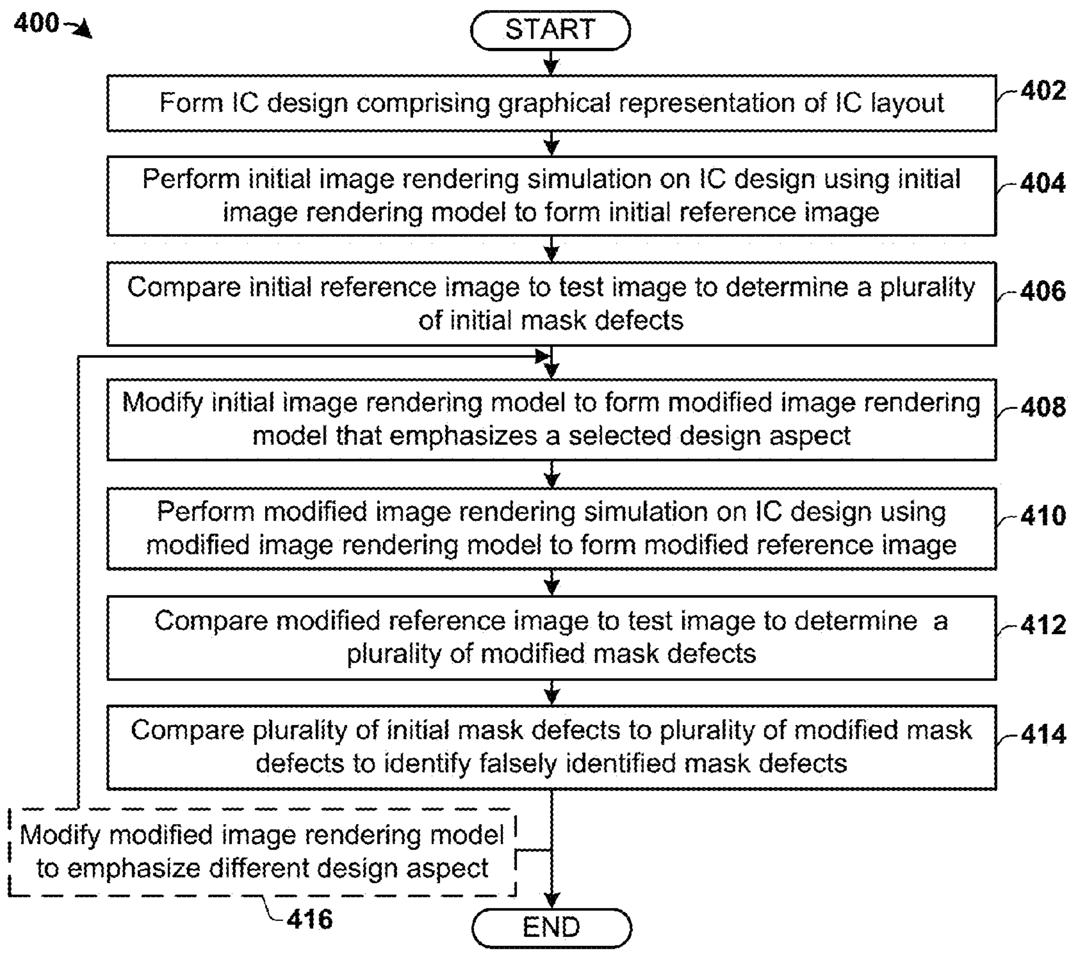
FIG. 4 illustrates a flow diagram of some additional embodiments of a disclosed method of inspecting a photomask to decrease falsely identified mask defects.

FIG. 4 illustrates a flow diagram of some additional embodiments of a method 400 of inspecting a photomask to decrease falsely identified mask defects.

At 402, an integrated circuit (IC) design comprising a graphical representation of integrated circuit layout is formed. In some embodiments, the IC design may be formed by a designer using a design software program.

At 404, an initial image rendering simulation is performed on the IC design, using an initial image rendering model, to form an initial reference image.

At 406, the initial reference image is compared to a test image to determine a plurality of initial mask defects. The plurality of initial mask defects comprise locations where shapes of the test image do not sufficiently match corresponding shapes of the initial reference image.

At 408, the initial image rendering model is altered to form a modified image rendering model that emphasizes a selected design aspect. In various embodiments, the selected design aspect may comprise size, corner rounding, or amplitude, for example.

At 410, an image rendering simulation is performed on the IC design, using the modified image rendering model, to form a modified reference image.

At 412, the modified reference image is compared to a test image to identify a plurality of modified mask defects. The plurality of modified mask defects comprise locations where shapes of the test image do not sufficiently match corresponding shapes of the modified reference image. Since the modified image rendering model emphasizes a selected design aspect, the plurality of modified mask defects are more accurate with respect to the selected design aspect than the plurality of initial modified mask defects.

At 414, the plurality of initial mask defects and the plurality of modified mask defects are compared to determine falsely identified mask defects relating to the selected design aspect. The falsely identified mask defects may be removed from the initial mask defects to mitigate falsely identified mask defects corresponding to the selected design aspect.

In some embodiments, acts 408-414 of method 400 may be performed iteratively, wherein during separate iterations different design aspects (e.g., sizing, corner, rounding, amplitude, etc.) are emphasized in the modified image rendering model. For example, at 418, the modified image rendering model may be altered to form a modified image rendering model that emphasizes a different selected design aspect. By sequentially running a plurality of modified image rendering models with varying emphasis on different design aspects, false mask defects corresponding to each of the different design aspects may be mitigated.

For example, during a first iteration a modified image rendering model that emphasizes corner rounding may be run to identify falsely identified corner rounding mask defects. During a second iteration a modified image rendering model that emphasizes size may be run to identify falsely identified size mask defects. During a third iteration a modified image rendering model that emphasizes amplitude may be run to identify falsely identified amplitude mask defects (i.e., mask defects identified by differences in a simulated gray level values and actual gray level values achieved by a topography of an on-chip structure). The falsely identified rounding, size, and amplitude mask defects may be removed from the initial mask defects to provide for a reduced number of falsely identified mask defects and therefore improve mask inspect.

Figure 5:
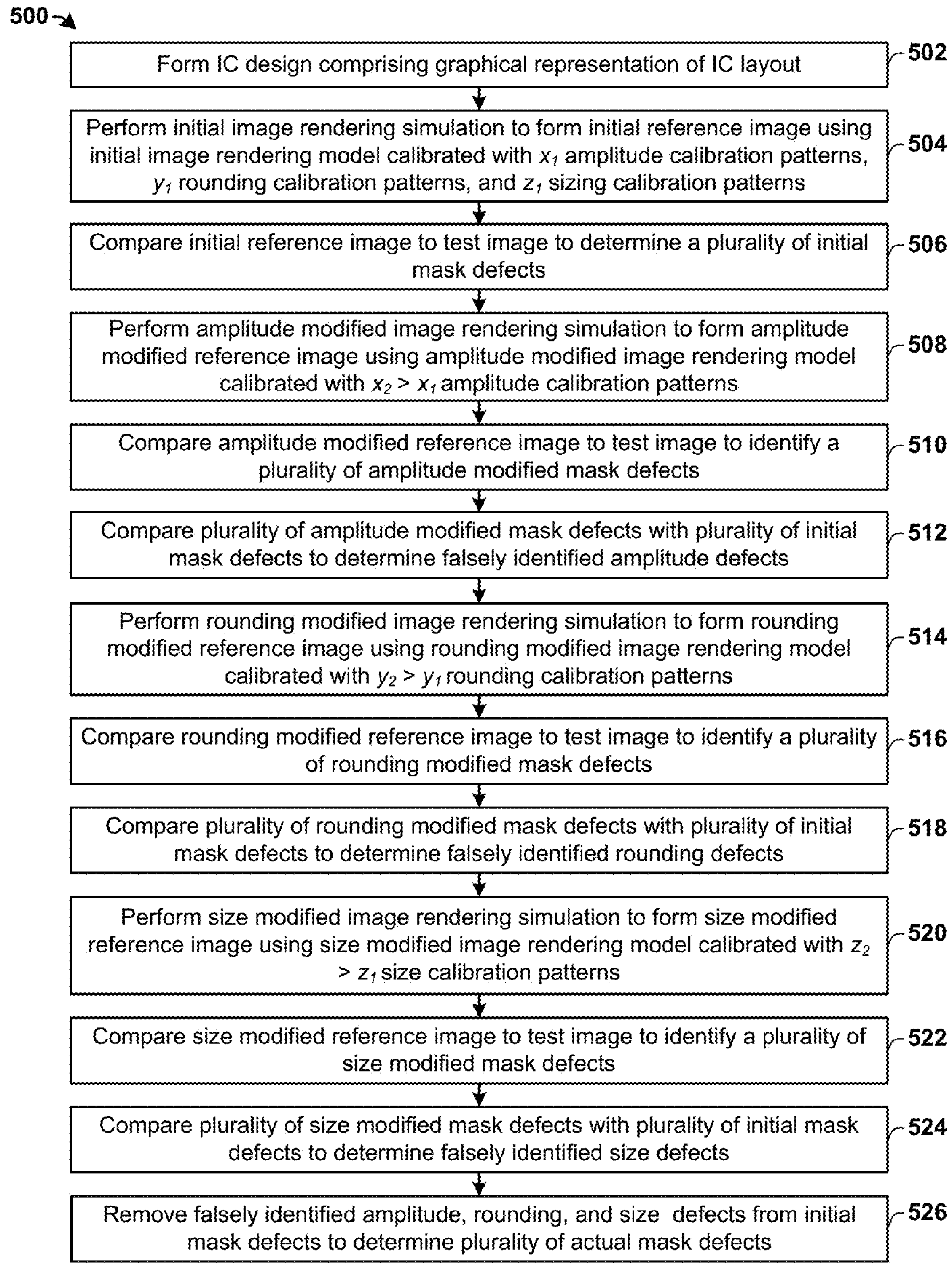
FIG. 5 illustrates a flow diagram of some embodiments of a method of inspecting a photomask by using a plurality of image rendering models with varying emphasis on size, corner rounding, and amplitude.

FIG. 5 illustrates a flow diagram of some embodiments of a method 500 of inspecting a photomask by using a plurality of image rendering models with varying emphasis on size, corner rounding, and amplitude.

While disclosed methods (e.g., methods 100, 400, and 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, an integrated circuit (IC) design comprising a graphical representation of integrated circuit layout is formed.

At 504, an initial image rendering simulation is performed to form an initial reference image using an initial image rendering model calibrated with a first number of amplitude calibration patterns ($x_1$), a first number of corner rounding calibration patterns ($y_1$), and a first number of sizing calibration patterns ($z_1$). In some embodiments, the number of total calibration patterns (i.e., $x_1+y_1+z_1$) used by the initial image rendering simulation is equal to a first total value (e.g., 14 calibration patterns).

At 506, the initial reference image is compared to a test image to determine a plurality of initial mask defects.

At 508, an amplitude modified image rendering simulation is performed to form an amplitude modified reference image calibrated with a second number of amplitude calibration patterns ($x_2$) greater than the first number of amplitude calibration patterns ($x_1$). For example, in some embodiments, the first number of amplitude calibration patterns ($x_1$) is equal to 5, while the second number of amplitude calibration patterns ($x_2$) is equal to 8. In some embodiments, the number of total calibration patterns (i.e., $x_2+y_1+z_1$) used by the amplitude modified image rendering simulation is less than equal to a first total value (e.g., less than 14 calibration patterns).

At 510, the amplitude modified reference image is compared to the test image to identify a plurality of amplitude modified mask defects.

At 512, the plurality of amplitude modified mask defects are compared with the plurality of initial mask defects to determine falsely identified amplitude defects.

At 514, a rounding modified image rendering simulation is performed to form a rounding modified reference image calibrated with a second number of corner rounding calibration patterns ($y_2$) greater than the first number of corner rounding calibration patterns ($y_1$). For example, in some embodiments, the first number of corner rounding calibration patterns ($y_1$) is equal to 5, while the second number of corner rounding calibration patterns ($y_2$) is equal to 8. In some embodiments, the number of total calibration patterns (i.e., $x_1+y_2+z_1$) used by the rounding modified image rendering simulation is less than equal to a first total value (e.g., less than 14 calibration patterns).

At 516, the rounding modified reference image is compared to the test image to identify a plurality of rounding modified mask defects.

At 518, the plurality of rounding modified mask defects are compared with the plurality of initial mask defects to determine falsely identified rounding defects.

At 520, a size modified image rendering simulation is performed to form a size modified reference image calibrated with a second number of size calibration patterns ($z_2$) greater than the first number of size calibration patterns ($z_1$). For example, in some embodiments, the first number of size calibration patterns ($z_1$) is equal to 5 while the second number of size calibration patterns ($z_2$) is equal to 8. In some embodiments, the number of total calibration patterns (i.e., $x_1+y_1+z_2$) used by the size modified image rendering simulation is less than equal to a first total value (e.g., less than 14 calibration patterns). In some embodiments, a summation of the second number of calibration patterns (i.e., $x_2+y_2+z_2$) used by each modified image rendering simulations is greater than the number of total calibration patterns (i.e., $x_1+y_1+z_1$) used by the initial image rendering simulation.

At 522, the size modified reference image is compared to the test image to identify a plurality of size modified mask defects.

At 524, the plurality of size modified mask defects are compared with the plurality of initial mask defects to determine falsely identified size defects.

At 526, the falsely identified amplitude, rounding, and size defects are removed from the initial mask defects to determine a plurality of actual mask defects. The plurality of actual mask defects is less than the initial number of mask defects, thereby improving mask inspection.

FIGS. 6A-6E illustrate some embodiments of set diagrams 600*a*-600*e* showing the mitigation of falsely identified mask defects by a mask inspection process that sequentially runs a plurality of image rendering models with varying emphasis on different design aspects to the method of inspecting a photomask described in FIG. 5.

FIG. 6A illustrates some embodiments of a set diagram 600*a* showing a set illustrating a plurality of initial mask defects 602*a* detected by an initial image rendering simulation. For example, the initial image rendering simulation may identify a plurality of initial mask defects 602*a* that is equal to 1000 mask defects.

FIG. 6B illustrates some embodiments of a set diagram 600*b* showing a set illustrating a plurality of falsely identified amplitude defects 604 detected using an amplitude modified image rendering simulation. For example, the amplitude modified image rendering simulation may identify a plurality of falsely identified amplitude defects 604 that is equal to 350 mask defects. By removing the plurality of falsely identified amplitude defects 604 from the plurality of initial mask defects 602*a*, plurality of actual mask defects 602*b* is reduced by 350 mask defects.

FIG. 6C illustrates some embodiments of a set diagram 600*c* showing a set illustrating a plurality of falsely identified rounding defects 606 detected by a rounding modified image rendering simulation. For example, the rounding modified image rendering simulation may identify a plurality of falsely identified rounding defects 606 that is equal to 200 mask defects. By removing the plurality of falsely identified rounding defects 606 from the plurality of initial mask defects 602*a*, the plurality of actual mask defects 602*c* is reduced by 200 mask defects.

FIG. 6D illustrates some embodiments of a set diagram 600*d* showing a set illustrating a plurality of falsely identified size defects 608 detected by a size modified image rendering simulation. For example, the size modified image rendering simulation may identify a plurality of falsely identified size defects 608 that is equal to 300 defects. By removing the plurality of falsely identified size defects 608 from the plurality of initial mask defects 602*a*, the plurality of actual mask defects 602*d* is reduced by 300 mask defects.

FIG. 6E illustrates some embodiments of a set diagram 600*e* showing a set illustrating the removal of the plurality of falsely identified amplitude defects 604, rounding defects 606, and size defects 608 from the plurality of initial mask defects 602*a* to achieve a plurality of actual mask defects 602*e*. The remaining plurality of actual mask defects 602*e* (e.g., 150 defects) is less than the plurality of initial mask defects 602*a* (e.g., 1000 defects), thereby improving mask inspection.

Figure 7:
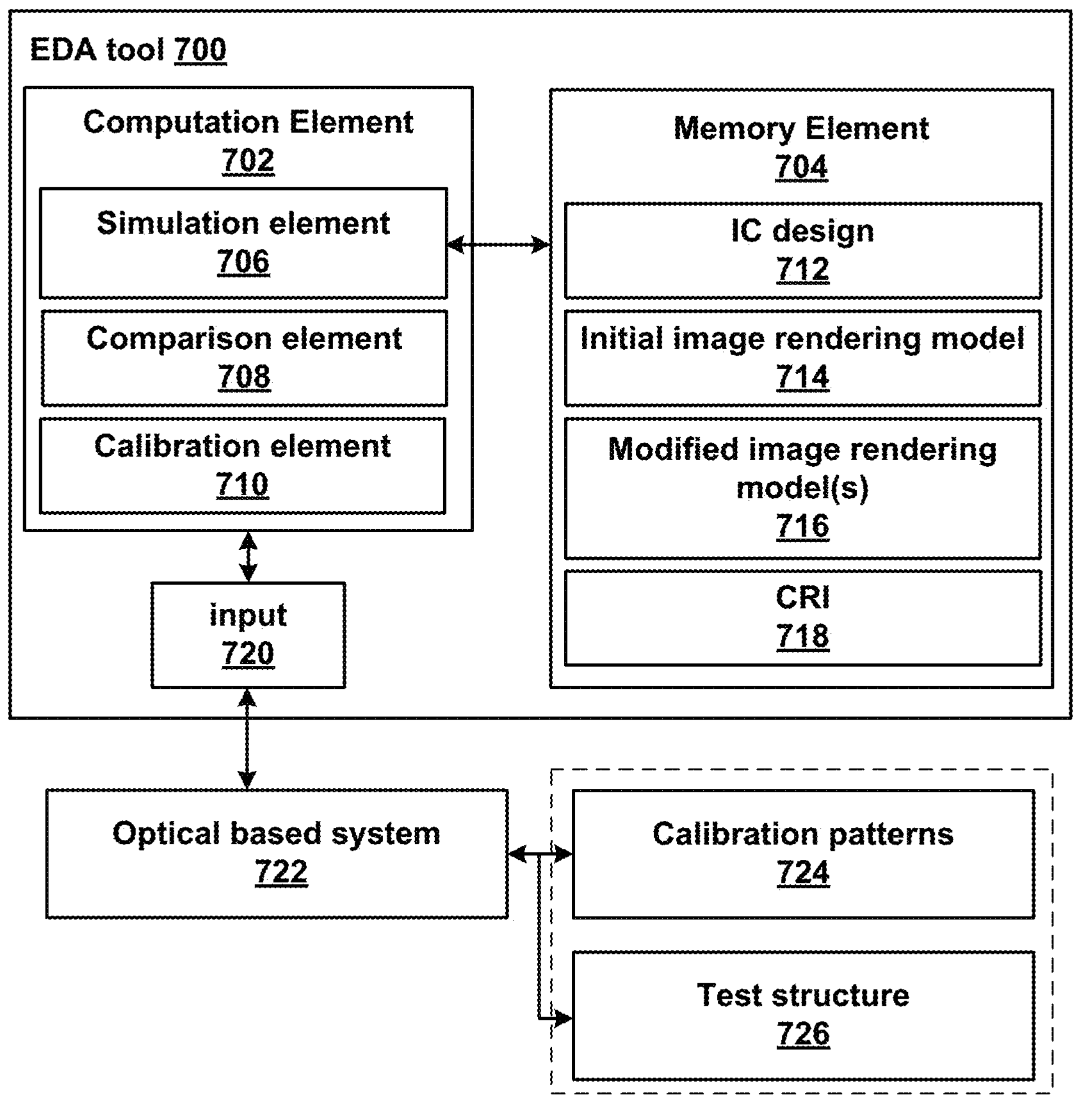
FIG. 7 illustrates a block diagram of some embodiments of a computer system configured to execute the disclosed method of mask inspection.

FIG. 7 illustrates a block diagram of some embodiments of a computer system 700 configured to execute the disclosed method of mask inspection.

The computer system 700 comprises a computation element 702 and a memory element 704. The computation element 702 comprises an image rendering simulation element 706, a comparison element 708, and a calibration element 710. The memory element 704 is configured to store an integrated circuit (IC) design 712 (e.g., a GDS or GDSII file, a CIF file, or an OASIS file), an initial image rendering model 714, one or more modified image rendering models 716, and computer readable instructions (CRI) 718 that may provide for a method of operating one or more components of the computer system 700 according to a disclosed method (e.g., method 100, 400, and/or 500). In various embodiments, the memory element 704 may comprise an internal memory or a computer readable medium.

The computer system 700 further comprises an input element 720 configured to receive images from an optical or electronic based system 722, configured to provide images of on-chip structures. In some embodiments, the images may comprise calibration patterns 724 that are used by the element unit 710 to calibrate the initial image rendering model 714 and/or the one or more modified image rendering models 716. For example, calibration patterns 724 may be used to improve simulation accuracy of corner rounding, amplitude, and/or size in the initial image rendering model 714 and/or the one or more modified image rendering models 716. In some embodiments, the images may comprise a test image of a test structure 726. In some embodiments, the calibration patterns 724 may be located on the test structure 726.

The image rendering simulation element 706 is configured to perform a first image rendering simulation on the IC design 712 using the initial image rendering model 714 to form an initial reference image. The comparison element 708 is configured to compare the initial reference image to the test image to determine a plurality of initial mask defects. The image rendering simulation element 706 is further configured to perform additional image rendering simulations on the IC design 712 using the modified image rendering models 716 to form modified reference images. The comparison element 708 then compares the modified reference images to the test image to determine a plurality of modified mask defects. The comparison element 708 is further configured to compare the plurality of initial mask defects with the plurality of modified mask defects to determine falsely identified mask defects.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method of inspecting a photomask by using a plurality of image rendering models with varying emphasis on different design aspects to decrease false defects, and an associated apparatus.

In some embodiments, the present disclosure relates to a method of inspecting a photomask. The method comprises forming an integrated circuit (IC) design comprising a graphical representation of an integrated circuit layout. The method further comprises determining a plurality of initial mask defects comprising defects in a photomask formed from the IC design. The method further comprises performing a modified image rendering simulation on the IC design using a modified image rendering model that emphasizes a selected design aspect to determine a plurality of modified mask defects. The method further comprises comparing the plurality of initial mask defects with the plurality of modified mask defects to determine falsely identified mask defects associated with the selected design aspect.

In other embodiments, the present disclosure relates to a method of inspecting a photomask. The method comprises forming an integrated circuit (IC) design comprising a graphical representation of an integrated circuit layout. The method further comprises performing a modified image rendering simulation on the IC design using an initial image rendering model to form an initial reference image, and comparing the initial reference image to a test image of on-chip structures to determine a plurality of initial mask defects comprising defects in a photomask formed from the IC design. The method further comprises performing additional modified image rendering simulations on the IC design using a plurality of modified image rendering models that respectively emphasize one of a plurality of different design aspects to form a plurality of modified reference images, and individually comparing the plurality of modified reference images to the test image to determine a plurality of modified mask defects. The method further comprises comparing the plurality of initial mask defects with the plurality of modified mask defects to determine falsely identified mask defects associated with the different design aspects.

In yet other embodiments, the present disclosure relates to a computer system configured to perform an inspection of a photomask. The computer system comprises a memory element configured to store an integrated circuit (IC) design comprising a graphical representation of an integrated circuit layout. The computer system further comprises an image rendering simulation element configured to perform a modified image rendering simulation on the IC design using a modified image rendering model that emphasizes a selected design aspect to determine a plurality of modified mask defects. The computer system further comprises a comparison element configured to determine a plurality of initial mask defects comprising defects in a photomask formed from the IC design, and to compare the plurality of initial mask defects with the plurality of modified mask defects to determine falsely identified mask defects.

What is claimed is:

1. A method of inspecting a photomask, comprising:

using a simulation element to perform an initial image rendering model to determine a plurality of initial mask defects comprising defects in a photomask formed from an integrated circuit (IC) design comprising a graphical representation of an integrated circuit layout;

using a simulation element to perform a plurality of modified image rendering simulations on the IC design using a plurality of modified image rendering models, that respectively emphasize different types of lithography errors relative to the initial image rendering model, to determine a plurality of sets of modified mask defects;

using a comparison element to compare the plurality of initial mask defects with the plurality of sets of modified mask defects to determine falsely identified mask defects associated with the different types of lithography errors; and forming a photomask from the IC design.

2. The method of claim 1, wherein determining the plurality of sets of modified mask defects comprises:

performing the plurality of modified image rendering simulations on the IC design using the plurality of modified image rendering models to form a plurality of modified reference images; and comparing the plurality of modified reference images to a test image comprising an image of on-chip structures to determine the plurality of sets of modified mask defects.

3. The method of claim 1, wherein determining the plurality of initial mask defects comprises:

performing an initial image rendering simulation on the IC design using the initial image rendering model to form an initial reference image; and comparing the initial reference image to a test image comprising an image of on-chip structures to determine the plurality of initial mask defects.

4. The method of claim 1, wherein the initial image rendering model is calibrated using a first number of calibration patterns relating to one of the different types of lithography errors; and wherein the plurality of modified image rendering models are calibrated using a second number of calibration patterns relating to the one of the different types of lithography errors that is greater than the first number of calibration patterns.

5. The method of claim 4, wherein the initial image rendering model is performed on a first number of design shapes of the IC design; and wherein the plurality of modified image rendering models are performed on the first number of design shapes of the IC design.

6. The method of claim 1, further comprising:

performing a first plurality of modified image rendering simulations that emphasize a first one of the different types of lithography errors, that is a size of a design shape in the IC design, with respect to other ones of the different types of lithography errors;

performing a second plurality of modified image rendering simulation that emphasize a second one of the different types of lithography errors, that is a corner rounding of the design shape, with respect to other ones of the different types of lithography errors; and performing a third plurality of modified image rendering simulation that emphasize a third one of the different types of lithography errors, that is an amplitude of the design shape obtained from a topography of an on-chip structure corresponding to the design shape, with respect to other ones of the different types of lithography errors.

7. The method of claim 1, further comprising:

removing the falsely identified mask defects from the plurality of initial mask defects to determine a plurality of actual mask defects.

8. The method of claim 1, wherein respectively emphasizing the different types of lithography errors comprises emphasizing a corner rounding of a design shape more than a size of the design shape.

9. The method of claim 1, wherein the initial image rendering model and the plurality of modified image rendering simulations are performed on the entire IC design.

10. The method of claim 1, further comprising:

comparing a first of the plurality of sets of modified mask defects with the plurality of initial mask defects to determine a first set of mask defects having falsely identified errors; and comparing a second of the plurality of sets of modified mask defects with the plurality of initial mask defects to determine a second set of mask defects having falsely identified errors, wherein the first set of mask defects and the second set of mask defects are associated with one or more same design shapes.

11. The method of claim 1, wherein the plurality of modified image rendering simulations are performed on a same number of design shapes of the IC design.

12. A method of inspecting a photomask, comprising:

forming an integrated circuit (IC) design comprising a graphical representation of an integrated circuit layout having a plurality of design shapes;

using a simulation element to perform an initial image rendering simulation on the IC design using an initial image rendering model to form an initial reference image used to determine a plurality of initial mask defects comprising defects in a photomask formed from the IC design;

using a simulation element to perform a plurality of modified image rendering simulations on the IC design using a plurality of modified image rendering models, that respectively emphasize one of a plurality of different types of lithography errors over another one of the plurality of different types of lithography errors, to form a plurality of modified reference images used to determine a plurality of sets of modified mask defects associated with the different types of lithographic errors;

using a comparison element to compare the plurality of initial mask defects with a first of the plurality of sets of modified mask defects to determine a first set of falsely identified mask defects associated with a first type of lithography error, and with a second of the plurality of sets of modified mask defects to determine a second set of falsely identified mask defects associated with a second type of lithography error, wherein the first set of falsely identified mask defects and the second set of falsely identified mask defects are associated with one or more same design shapes; and forming a photomask from the IC design.

13. The method of claim 12, further comprising:

removing the falsely identified mask defects from the plurality of initial mask defects to determine a plurality of actual mask defects.

14. The method of claim 12, wherein the plurality of different types of lithography errors comprise a size of a design shape in the IC design, a corner rounding of the design shape, and an amplitude of the design shape.

15. The method of claim 12, wherein the initial image rendering model is calibrated using a first number of calibration patterns relating to the one of the plurality of different types of lithography errors; and wherein the plurality of modified image rendering models are respectively calibrated using a second number of calibration patterns relating to the one of the plurality of different types of lithography errors that is greater than the first number of calibration patterns.

16. The method of claim 15, wherein the initial image rendering model is calibrated using a first number of total calibration patterns; and wherein the plurality of modified image rendering models are respectively calibrated using a second number of total calibration patterns that is less than the first number of total calibration patterns.

17. The method of claim 12, wherein the plurality of modified image rendering simulations are performed on a same number of design shapes of the IC design.

18. A computer system configured to perform an inspection of a photomask, comprising:

a memory element configured to store an integrated circuit (IC) design comprising a graphical representation of an integrated circuit layout;

an image rendering simulation element configured to perform an initial image rendering simulation on the IC design using an initial image rendering model to form an initial reference image, and to perform a plurality of modified image rendering simulations on the IC design using a plurality of modified image rendering models that respectively emphasize different types of lithography errors relative to the initial image rendering model to determine a plurality of sets of modified mask defects;

a comparison element configured to: determine a plurality of initial mask defects comprising defects in a photomask formed from the IC design; and compare the plurality of initial mask defects with the plurality of sets of modified mask defects to determine falsely identified mask defects; and a mask formation element configured to form a mask from the integrated circuit layout.

19. The system of claim 18, wherein the initial image rendering model is calibrated using a first number of calibration patterns relating to one of the different types of lithography errors; and wherein the modified image rendering model is calibrated using a second number of calibration patterns relating to the one of the different types of lithography errors that is greater than the first number of calibration patterns.

20. The system of claim 18, wherein the initial image rendering model is calibrated using a first number of total calibration patterns; and wherein the plurality of modified image rendering models are calibrated using a second number of total calibration patterns that is less than the first number of total calibration patterns.

* * * * *